United States Patent [19]

Feng

[11] 4,038,110
[45] July 26, 1977

[54] PLANARIZATION OF INTEGRATED CIRCUIT SURFACES THROUGH SELECTIVE PHOTORESIST MASKING

[75] Inventor: Bai-Cwo Feng, Wappingers Falls, N.Y.

[73] Assignee: IBM Corporation, Armonk, N.Y.

[21] Appl. No.: 696,102

[22] Filed: June 14, 1976

Related U.S. Application Data

[62] Division of Ser. No. 480,086, June 17, 1974, Pat. No. 3,976,524.

[51] Int. Cl.² .......................................... H01L 21/308
[52] U.S. Cl. .................................... 148/187; 148/175; 357/73
[58] Field of Search ................. 148/175, 187; 357/73; 156/8

[56] References Cited
U.S. PATENT DOCUMENTS

| | | |
|---|---|---|
| 3,681,153 | 8/1972 | Clark et al. .......................... 148/187 |
| 3,783,047 | 1/1974 | Paffen et al. ........................ 148/187 |
| 3,883,889 | 5/1975 | Hall ....................................... 357/73 |
| 3,961,999 | 6/1976 | Antipov ................................ 148/175 |
| 3,966,514 | 6/1976 | Feng et al. ........................... 148/187 |

Primary Examiner—L. Dewayne Rutledge
Assistant Examiner—J. M. Davis
Attorney, Agent, or Firm—J. B. Kraft

[57] ABSTRACT

An integrated circuit substrate surface, particularly a surface of electrically insulative material, having a pattern of elevated areas and a complementary pattern of unelevated areas is planarized by forming the photoresist pattern in registration with the pattern of unelevated areas, the photoresist pattern having narrower lateral dimensions than said elevated pattern whereby registration is facilitated, flowing the photoresist pattern to laterally expand the photoresist to cover and thereby mask the unelevated areas, and etching to lower the elevated area which remain uncovered by the photoresist.

3 Claims, 20 Drawing Figures

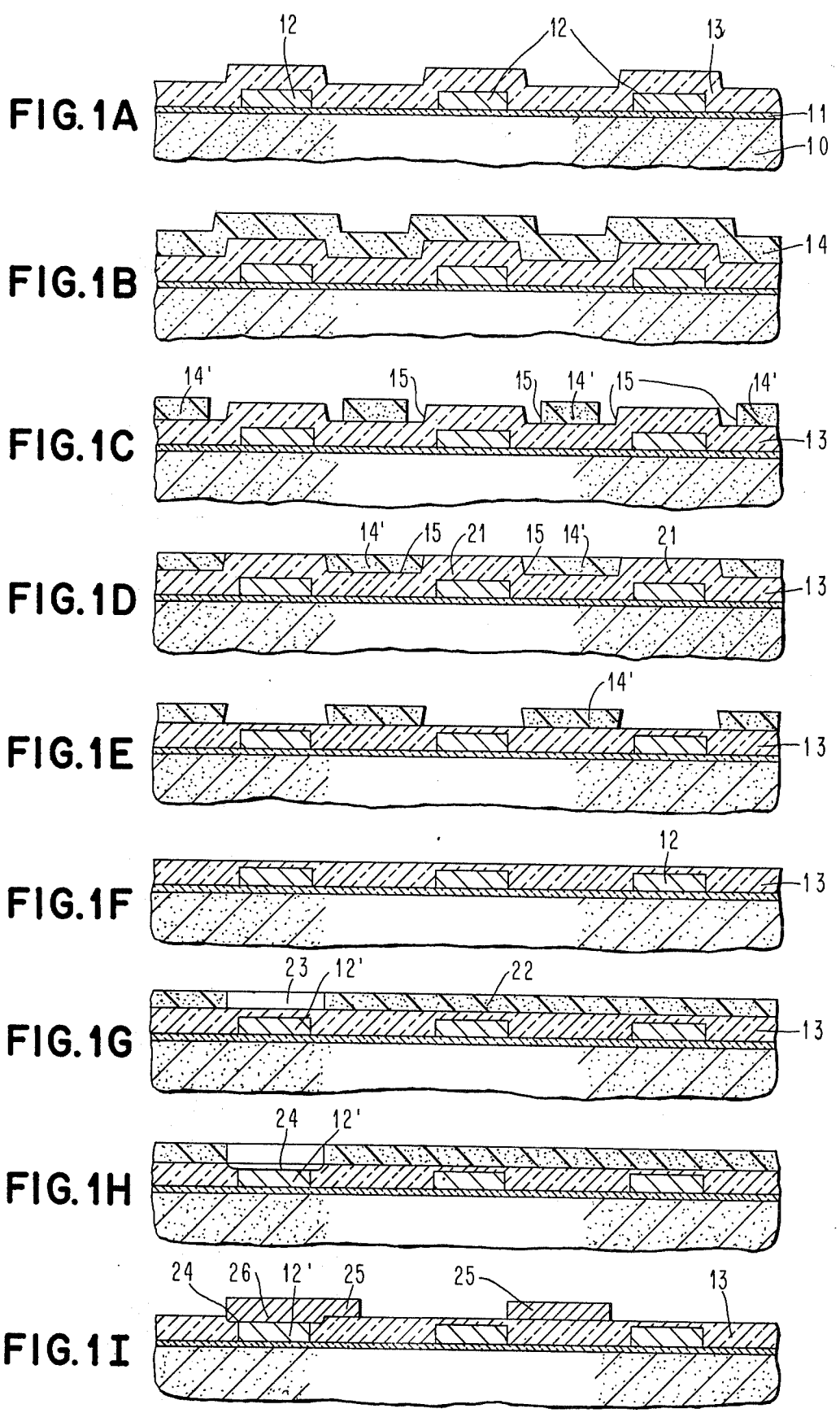

PLANARIZATION OF INTEGRATED CIRCUIT SURFACES THROUGH SELECTIVE PHOTORESIST MASKING

This is a division, of application Ser. No. 480,086 filed June 17, 1974, now Patent No. 3,976,524.

BACKGROUND OF THE INVENTION

This invention relates to the planarization of integrated circuit surfaces, particularly the planarization of the layers of dielectric or electrically insulative material which are used for passivation and electrical insulation at various levels of integrated circuits.

In the construction of high density integrated circuits utilizing conventional thin film techniques and structures wherein electrically insulative layers such as silicon dioxide or silicon nitride are deposited by conventional chemical vapor or sputter deposition techniques over underlying metallization patterns, the insulative layer tends to follow the contours of the underlying metallization lines. In other words, a line in the metallization pattern will result in a corresponding elevation in the covering insulative layer over the metallization pattern. In integrated circuits having multi-levels of metallization, the cumulative effect of such elevation in the insulative layers is highly undesirable.

For example, a line in the metallization pattern may result in a corresponding elevation in the covering dielectric layer over the metallization pattern. Then, after a subsequent level metallization pattern is deposited onto the covering layer and it, in turn, covered by an additional insulative layer, the upper surface of the additional covering layer will display the cumulative effects of both underlying metallization patterns. We have, in such cases, a "skyscraper" effect wherein the cumulative metallic lines produce pronounced elevations which render the surface of an uppermost insulative layer so irregular that metallization lines deposited over such a layer extend over a very bumpy surface. This tends to produce discontinuities in the metal lines.

In addition, in such structures, it is difficult to design a structure in which a via hole through a given covering layer of dielectric material to an underlying metallization line may be made with consistent control so as to avoid over-etching through the insulative layer under the metallization, thereby shorting out the conductive line through its underlying insulation.

The problems with such elevation and irregularity in integrated circuit levels are discussed in detail in U.S. Pat. No. 3,804,738.

In addition, undesirable elevations in integrated circuit surfaces, particularly in the surfaces of insulative layers, present a problem in the formation of dielectrically isolated integrated circuits. Such dielectrically isolated integrated circuits are characterized by patterns of moats or trenches extending from the surface of a semiconductor substrate to isolate respectively a plurality of pockets on the semiconductor material. Where the dielectric or insulative layers are deposited over such mesa-like structures, the result is a pattern of steps or elevations in the insulated layer corresponding to the pattern of mesas in the substrate. Depending on the techniques utilized to fill the trenches or moats with dielectric material, these steps may often be quite steep which, as previously mentioned, could result in discontinuities in the metallization placed on the insulative layer.

In order to avoid such variation in the insulative layer, one approach in the art has been to oxidize the silicon substrate surrounding the trench or moat by heating to form thermal oxide which fills in the trench providing the lateral insulation and a relatively planar surface upon which surface insulative layers can thereafter be applied. This process is described in detail in an article entitled "Local Oxidation of Silicon and Its Applications in Semiconductor Device Technology", J. A. Appels, et al., Phillips Research Reports 25, page 118, (1970).

While this approach may be used in methods where it is possible to oxidize the substrate in situ to fill in the trenches, the art has yet to develop a practical approach wherein planarization may be achieved in a method wherein the trenches are filled with the dielectric or insulative material by deposition techniques such as vapor deposition or RF sputter deposition. The problems involved in the planarization of such deposited insulative layers are essentially the same as those previously described with respect to planarization of insulative layers over a metallization pattern except that the steps or elevations often tend to be even higher, thereby making the problem even more difficult.

In the prior art, primarily two approaches have been offered for lowering the elevations or steps in such insulative layers to, thereby, planarize the surface. The first approach involves resputtering of the elevations. Although this approach has been effective in planarizing elevations of relatively narrow widths, it is relatively time-consuming. In fact, the time factor becomes so pronounced that the resputtering approach becomes relatively burdensome where the elevations or steps are relatively wide.

The second approach involves masking the depressed areas or valleys with an etch-resistant material such as photoresist through conventional photolithographic techniques, and then etching to remove the uncovered elevations or steps. This approach often runs into problems with photoresist mask alignment. In high density large scale integrated circuits, the dimensions are so minute that difficulties may be encountered in obtaining the exact registration required to completely mask the depressed areas or valleys with photoresist. Any misalignment which leaves a portion of a depressed area exposed could result in an etch through the insulative layer in said depressed area simultaneously with the planarization of the elevated area. This will result in an undesirable short circuit path through the insulative layer in the depressed area.

SUMMARY OF THE INVENTION

Accordingly, it is a primary object of the present invention to provide a method for lowering the elevated areas on a substrate surface having a pattern of elevated areas and a complementary pattern of unelevated areas.

It is another object of the present invention to provide a method for lowering the elevated areas in an insulative layer over an integrated circuit, which insulative layer has a pattern of elevated areas and a complementary pattern of unelevated areas.

It is yet a further object of the present invention to provide a method for lowering the elevations in an insulative layer formed over a metallization pattern in an integrated circuit, which elevations correspond to said metallization pattern.

It is yet another object of the present invention to provide a method for lowering the elevations in an insulative layer formed over an integrated circuit surface having pockets of semiconductor material surrounded by trenches, which elevations correspond to said pockets.

It is still another object of the present invention to provide a method for lowering the elevations in a layer of insulative material in an integrated circuit having a pattern of elevated areas and a complementary pattern of unelevated areas by insuring that an etchresistant photoresist mask deposited in the unelevated areas completely blocks such unelevated areas against the etchant which is utilized to lower the elevated areas in said layer.

It is still a further object of the present invention to provide a method for lowering the elevations in an integrated circuit substrate having a pattern of elevated areas and a complementary pattern of unelevated areas by photolithographic etching techniques whereby complete coverage of the unelevated areas with a photoresist blocking mask is insured.

In accordance with the present invention, a method is provided for forming photoresist masking on a substrate having a pattern of elevated areas and a complementary pattern of unelevated areas. A photoresist pattern is applied in registration with the pattern of unelevated areas; said photoresist pattern has narrower lateral dimensions than said unelevated pattern whereby the registration is facilitated. The photoresist pattern is then flowed to laterally expand the photoresist to cover and thereby mask the unelevated areas. The photoresist flowing may be conveniently accomplished by treating the photoresist with a photoresist solvent, preferably the vapor of such a solvent.

Once the registered photoresist pattern is formed, fully covering all of the unelevated areas, any conventional etching step wherein the uncovered elevated areas are selectively etches while the photoresist remains relatively etch-resistant may be utilized to lower the elevated areas, and preferably to lower the elevated areas to the extent that the surface of the substrate is substantially planarized. The etching may be a chemical etching step or a sputter etching step. The method of the present invention is most effectively utilized where the substrate surface is an electrically insulative material. The two most common structures wherein an electrically insulative layer has such elevated and depressed areas is in insulative layers covering an underlying metallization pattern and in insulative layers which provide both surface and lateral insulation in dielectrically isolated integrated circuits comprising mesas or pockets of semiconductor material at the surface of the semiconductor substrate surrounded by a pattern of trenches. An insulative layer deposited over the latter structure will have elevations corresponding to the mesas and trenches and depressions corresponding to the trenches.

The foregoing and other objects, features and advantages of the invention will be apparent from the following more particular description and preferred embodiments of the invention as illustrated in the accompanying drawings.

BRIEF DESCRIPTION OF THE DRAWINGS

FIGS. 1A–II are diagrammatic, cross-sectional views of a portion of an integrated circuit chip illustrating the preferred embodiment of the present invention wherein a layer of insulative material deposited over a metallization pattern is planarized.

DESCRIPTION OF THE PREFERRED EMBODIMENTS

Figure 3I:
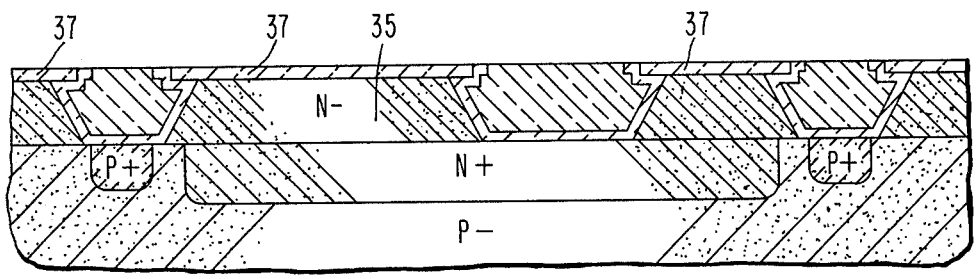
FIGS. 3A–3J are diagrammatic, cross-sectional views of another embodiment of the present invention involving the planarization of a layer of insulative material deposited over a semiconductor substrate structure having pockets of semiconductor material surrounded by a pattern of trenches. The layer of insulative material is to provide electric isolation for the structure.

With reference to FIGS. 1A-II, there will now be described the method of the present invention. The structure in these FIGS. is a portion of an integrated circuit chip. The structure may be formed in any of the conventional integrated circuit fabrication techniques, such as those described in U.S. Pat. No. 3,539,876. Silicon substrate 10 has formed thereon a bottom layer of insulative material 11 which may be silicon dioxide formed by the thermal oxidation of the surface of substrate 10 or a material deposited by chemical vapor deposition or sputtering. Such material include silicon dioxide, silicon nitride or aluminum oxide. Layer 11 acts to passivate or protect silicon substrate as well as to electrically insulate substrate 11 from a metallization interconnection pattern 12. The metallization pattern is formed on layer 11 by conventional integrated circuit fabrication techniques as described in U.S. Pat. No. 3,539,876, e.g., by photolithographic etching or sputter deposition. The metallization pattern is selectively connected to devices, not shown, at the surface of substrate 10 by connectors, not shown, selectively passing through the insulative layer 11 to the substrate. The metallization pattern is covered by an over-layer 13 of insulative material, such as silicon dioxide, which protects and insulates the metallization pattern. Metallization pattern 12 may be any conventional metal used in integrated circuits, such as aluminum, aluminum-copper alloys, platinum, palladium, chromium, or molybdenum.

Some typical dimensions for the layers of FIG. 1A in conventional high density integrated circuits would be: layer 11, a thickness in the order of 2,000A, metallization pattern 12, a thickness in the order of 10,000A and over-layer 13, a thickness in the order of 24,000A. As shown in FIG. 1B, photoresist layer 14 having a thickness in the order of 20,000A is deposited over the structure by conventional photoresist deposition techniques utilized in the integrated circuit art.

Next, as shown in FIG. 1C, utilizing conventional photoresist masking and exposure techniques, a photoresist mask 14' is formed in registration with depressed areas 15 of insulative layer 13. In accordance with the present state of the art, high density metallization patterns have line widths and spacings in the order of from 5 to 25 microns. Consequently, depressions 15 would have corresponding widths in the order of 5 to 25 microns. The registration of a photoresist pattern within depressed areas 15 would normally be very difficult in view of the minute dimensions. Accordingly, in order to facilitate such registration, photoresist lines 14' would be narrower in width than their corresponding depressions 15; lines 14' are preferably from 1.5 to 5 microns narrower than corresponding depressed areas 15.

Next, FIG. 1D, the photoresist is flowed whereby photoresist lines 14' expand and completely cover depressed areas 15. The flowing of the photoresist may be accomplished in the apparatus shown in FIG. 2. The wafers 16 are mounted on the rack 17 which is suspended above a reservoir of photoresist solvent 18 contained at the bottom of a closed tank 19. In order to insure full circulation, rack 17 has apertures 20 through which the solvent vapors may rise and circulate as shown.

With reference back to FIG. 1D, the flowed photoresist material is preferably a positive photoresist of the type described in U.S. Pat. Nos. 3,201,239, 3,046,120 and 3,666,473. I have found that such positive photoresists are very readily flowable when exposed to the vapors of conventional solvents for such photoresist within the closed system shown in FIG. 2. With such positive photoresist, the operation may be conveniently conducted at room temperature. A plurality of wafers having the structure shown in FIG. 1C are mounted, as shown, within the fully closed housing of the structure of FIG. 2. Within such a closed system, the vapor pressure from the solvent 18 is sufficient to produce the required solvent vapors at equilibrium, which usually occurs in less than three minutes at room temperature, to flow the photoresist.

Figure 2:
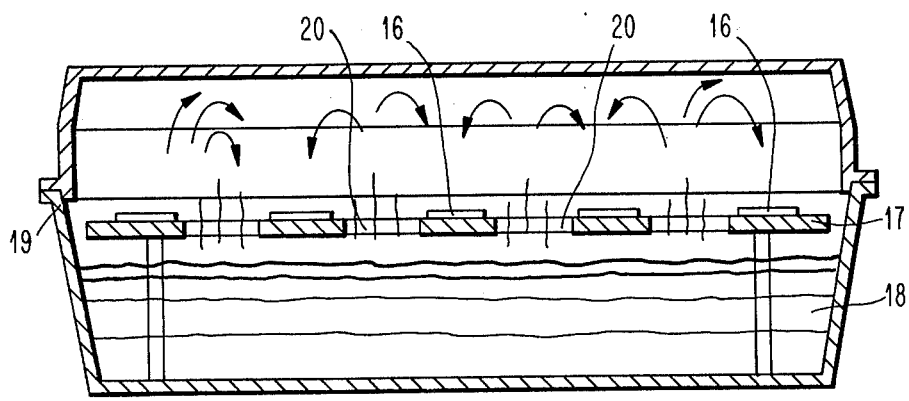
FIG. 2 is an illustrative, diagrammatic view of apparatus which may be used in flowing the photoresist in accordance with the present invention.

Suitable solvents which may be used in the system of FIG. 2 include conventional positive photoresist solvents such as ethers, esters and ketones, for example, methyl or ethyl Cellosolve acetate, with or without small amounts of butyl acetate; glycol monomethyl ether; glycol monoethyl ether; and aliphatic ketones such as methyl isobutyl ketone or acetone.

For a specific example in the method being described, composition II of Example 1 in U.S. Pat. No. 3,666,473 may be used. With this positive photoresist, a suitable solvent 18 to be used in the system of FIG. 2 comprises about 90% ethyl Cellosolve acetate and 10% n-butyl-acetate.

After about seven minutes in the closed system shown in FIG. 2, the photoresist is flowed producing the structure of FIG. 1D. When acetone is used, the cycle for flowing the photoresist can be greatly reduced.

While positive photoresist materials are preferable for pattern 14, negative photoresists may also be used. It should be recognized that negative photoresists are not as readily flowable as positive photoresists. Nonetheless, such negative photoresists may be utilized particularly in structures having line dimensions and, consequently, dimensions of elevations and depressions, in integrated circuits which are relatively larger than the minute dimensions for which positive photoresists produce the best results. Typical negative photoresists include synthetic resins such as polyvinyl cinnamate and polymethyl methacrylate. A description of such synthetic resins and the light sensitizers conventionally used in combination with them may be found in the text "Light Sensitive Systems", by Jaromir Kosar, particularly at Chapter 4. Some photoresist compositions of this type are described in U.S. Pat. Nos. 2,610,120; 3,143,423; and 3,169,868. With such negative photoresists, the standard solvents for the cross-linked negative photoresists may be used in the system of FIG. 2. As previously stated, with the negative photoresists, the time for achieving sufficient flowing to fill the depressed areas between elevations may be increased. One negative photoresist which should be suitable is KTFR distributed by Kodak Corporation. It comprises a cyclized rubber composition containing a photosensitive cross-linking agent. With the KTFR negative photoresist, a solvent comprising trichloroethylene may be used in the system of FIG. 2. Preferably, the vapor may be produced by heating the solvent to about 85° C prior to introduction into the system.

Next, FIG. 1E, utilizing conventional photolithographic etching techniques, elevations 21 in insulative layer 13 are removed with a standard etchant to substantially planarize layer 13, as shown. Let us assume for the present example that layer 13 is a silicon dioxide layer having a thickness of 24,000A. With such a layer, treatment with a buffered HF solution for approximately eight minutes will produce the structure shown in FIG. 1E.

Then, FIG. 1F, utilizing conventional photoresist stripping techniques, photoresist material 14' is removed leaving the substantially planarized insulative layer 13. With such a planarized layer, the effects of metallization pattern 12 in producing undesirable elevations in subsequent levels of metallization and insulative material is eliminated. In addition, the same planarization techniques may be used to remove the elevations in the insulative materials resulting from subsequent levels of metallization.

In addition, with the structure of FIG. 1F, it is possible to form via holes through insulative layer 13 to underlying metallization lines of pattern 12 without any of the undesirable effects which elevations produce on via hole formation, as set forth in U.S. Pat. No. 3,804,738.

For example, with reference to FIG. 1G, in forming a via hole through insulative layer 13 to metallization line 12', another photoresist mask 22 is formed in the conventional manner previously described. Aperture 23 in photoresist mask 22 has lateral dimensions which are preferably greater than line 12'.

Next, FIG. 1H, utilizing conventional photolithographic etching techniques, e.g., with an etchant such as buffered HF, via hole 24 is formed through the planarized portion of insulative layer 12'. Then, when the next level metallization pattern 25 is formed on insulative layer 13 using the techniques previously described, a portion of metallization 26 will extend through via hole 24 into contact with line 12'.

As previously indicated, the method of the present invention may also be used for the planarization of insulative layers which provide both surface and lateral isolation for mesas or pockets of semiconductor material in dielectrically isolated integrated circuits. Such structures are characterized by pockets or mesas of semiconductor material laterally enclosed by a pattern of trenches. An electrically insulative layer is deposited over the surface of such pockets to electrically insulate the surface and in the trenches surrounding the pockets to provide the lateral dielectric isolation for the pockets.

It should be understood that the advantages of the present invention may be utilized to provide planarization of such deposited insulative layers in any structure of this type. For the purposes of illustrating the present embodiment, reference is made to FIGS. 3A-3J. In this embodiment, there will be shown a method for forming planar dielectrically isolated structures in accordance with the present invention which further includes an expedient for preventing lateral damage to the isolated semiconductor pockets during the various photolithographic etching steps involved in forming the dielectric isolation as well as in forming regions of different conductivity types. With reference to FIG. 3A, the structure shown, which is formed by conventional integrated circuit fabrication techniques as set forth, for example, in U. S. Pat. No. 3,539,876, comprises a substrate 30, 15 mils in thickness,, supporting an N-epitaxial layer 31, 2 microns in thickness. Buried N+ region 32 and P+ region 33 are formed at the interface of substrate 30 and epitaxial layer 31.

Figure 3J:
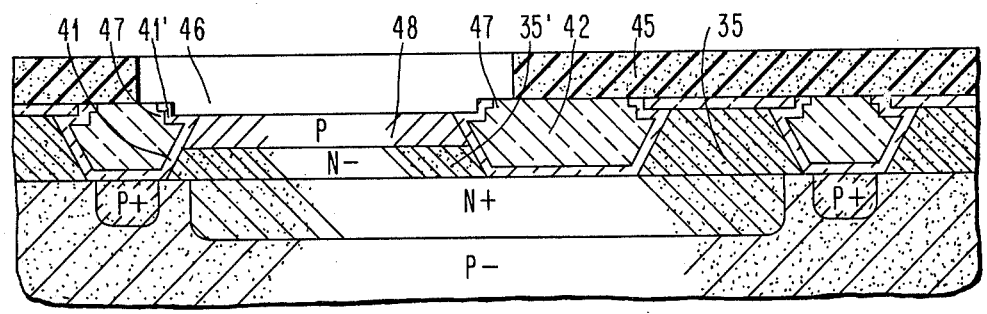
Figure 3A:
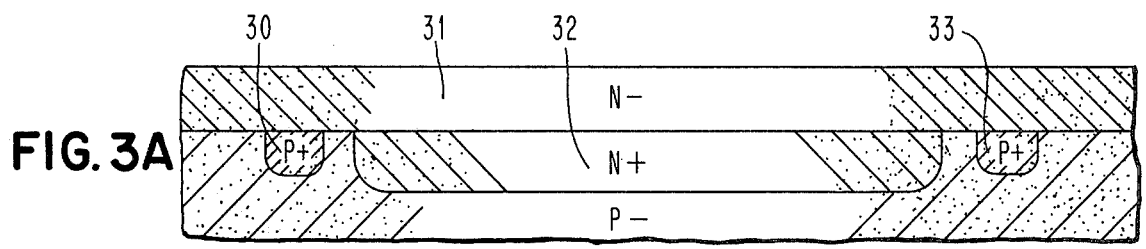
Figure 3B:
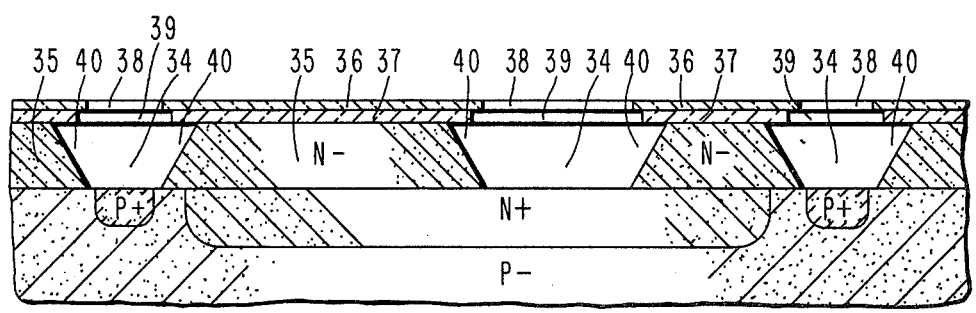

Next, as shown in FIG. 3B, a pattern of trenches 34 is formed extending through epitaxial layer 31 to isolate a plurality of pockets or mesas of N- semiconductor material 35. In the structure shown, the mesas or pockets 35 are silicon and the passivation or protective structure on the structure comprises a silicon nitride layer 36 which is bound to the surface of pockets 35 by a layer 37 of thermal silicon dioxide. First, openings 38 are etched through silicon nitride layer 36 by conventional photolithographic etching techniques employing a mask such as silicon dioxide and an etchant such as hot phosphoric acid which selectively etches the silicon nitride. Next, utilizing silicon nitride layer 36 as a mask, openings 39 are etched through silicon dioxide layer 37 with an etchant which selectively etches the silicon dioxide. An etchant which may be used for this purpose is buffered HF. While thermal oxide is etched, pyrolytic silicon dioxide is also removed.

At this stage, utilizing the resulting composite mask formed by layers 36 and 37, trenches 34 are etched in the silicon with an etchant which selectively etches the silicon. A typical etchant is a dilute nitric acidhydrofluoric acid solution comprising 500 parts by volume 70% nitric acid, 500 parts iodine-saturated nitric acid, 14 parts 40% ammonium fluoride, 2 parts 49% hydrofluoric acid and 5 parts 98% acetic acid. Utilizing this etchant, trenches 34 are formed and the etching is continued for a period of time sufficient to undercut silicon dioxide layer 37 at points where silicon pockets 35 abut trenches 34 at the surface of the structure.

It should be noted that in place of the mask formed by the composite of layers 37 and 36, any layer of insulative material may be used which provides an etch barrier in forming trenches 34.

Figure 3C:
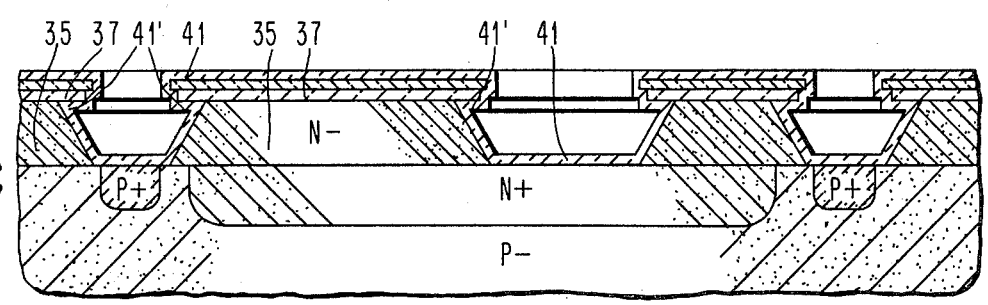

Next, FIG. 3C, another layer 41 of an insulative material which is etch-resistant to etchants for layer 37 is deposited over the structure including the trench surfaces, as shown. In these trenches, portions 41' of layer 41 are deposited under layer 37 in the undercut regions 40. In the present case where layer 37 is silicon dioxide, layer 41 is preferably a silicon nitride material, and most preferably, silicon oxynitride which appears to display a greater compatibility to silicon surfaces than does silicon nitride. The silicon oxynitride has a thickness in the order of 1,500A and may be deposited by conventional chemical vapor deposition techniques or RF sputter deposition techniques. Layer 41, particularly the portions thereof lining the sidewalls of the trenches as well as portions 41', protects pockets 35 from any lateral damage or etching when portions of layer 37 are substantially removed in order to introduce impurities in forming the various device regions within pockets 35. This will be described in greater detail hereinafter.

Figure 3D:
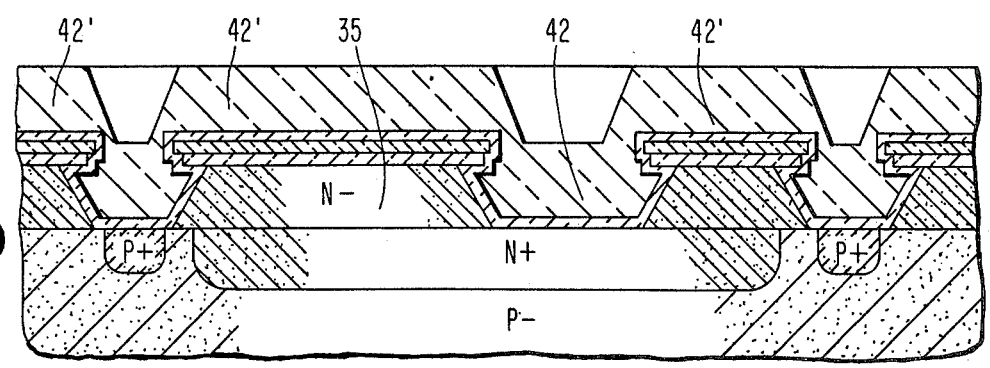

Next, FIG. 3D, layer 42 of an electrically insulative material which is selected to provide the lateral dielectric isolation within the trenches 34 is deposited to a thickness in the order of 1.2 microns which is sufficient to substantially fill the trenches. During the deposition process, layer 42 is also deposited over the surface of the structure. The portions of layer 42 on the surface provide elevated areas 42'. In the present embodiment, insulative layer 42 comprises silicon dioxide. It is in a structure such as the present one where both the dielectric isolation provided by layer 42 in the trenches and the layer over the surface of silicon pockets 35, i.e., silicon dioxide layer 37, are of the same material that the expedient of forming an etchresistant under layer 41' at the trench wall prevents lateral etching. Otherwise, when layer 37 is subsequently removed from portions of the structure, the etchant for layer 37 could also etch away portions of the dielectric isolation in the trenches provided by layer 42, thereby exposing the lateral walls of silicon pockets 35.

Even if layer 42 is a material other than layer 37, but one which would be attacked by the etchant for layer 37, layer 41 which lines the trenches would still serve its protective function.

Figure 3E:
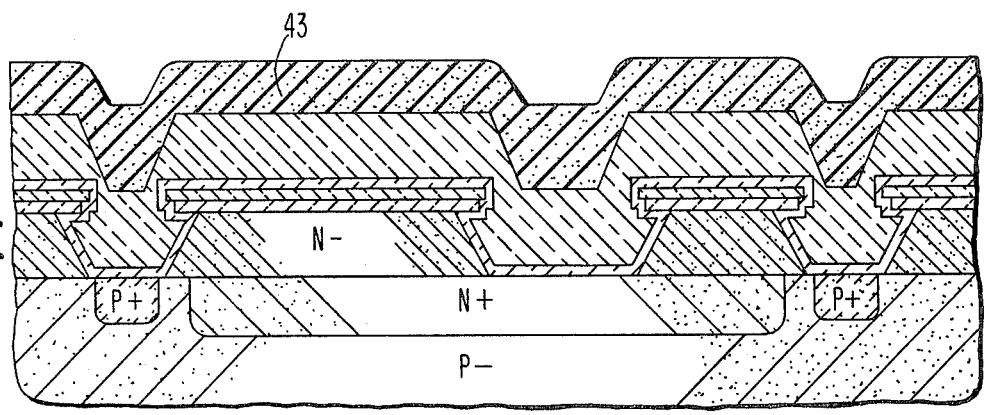

Then, with reference to FIG. 3E, elevated portions 42' are removed utilizing the photoresist masking techniques previously described, i.e., a layer of photoresist material 43 is deposited over the entire structure.

Figure 3F:
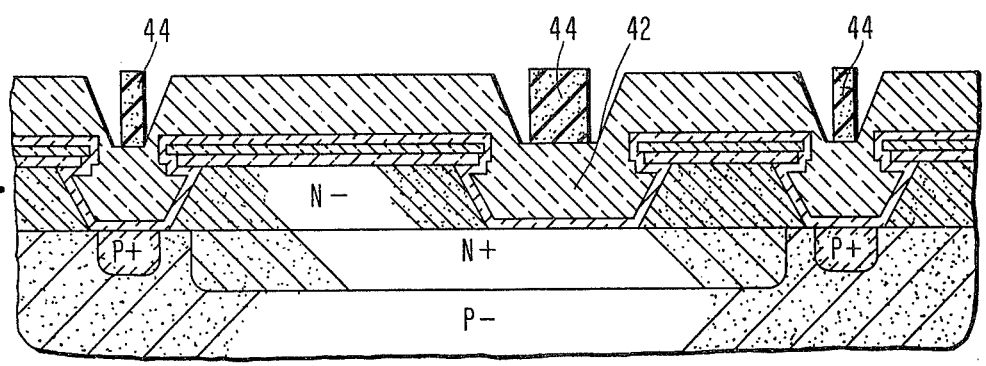

Next, as shown in FIG. 3F, utilizing conventional photoresist masking and exposure techniques, a photoresist mask 44 is formed in registration with the unelevated areas of insulative layer 42 in the manner described with respect to the embodiment of FIG. 1C. As with this previous embodiment, in order to facilitate registration between the photoresist pattern 44 and the unelevated areas, photoresist pattern 44 has lines which are narrower in width than the corresponding unelevated areas.

Figure 3G:
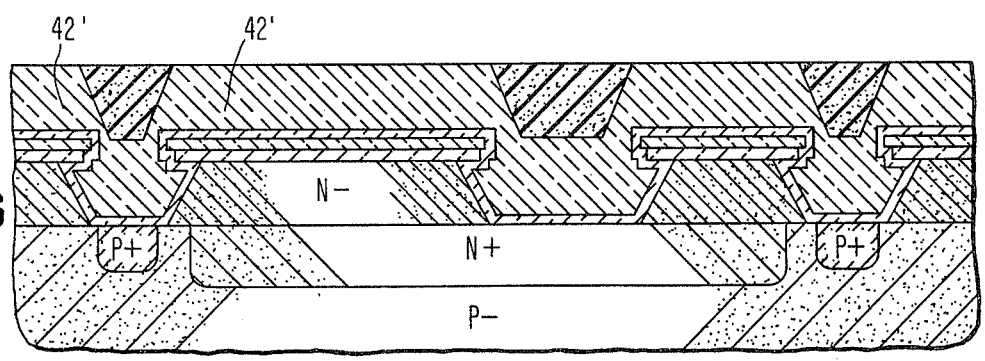

Then, utilizing the techniques previously described with respect to FIG. 2, the photoresist is flowed whereby lines 44 expand and completely cover the unelevated areas of insulative layer 42, as shown in FIG. 3G.

Figure 3H:
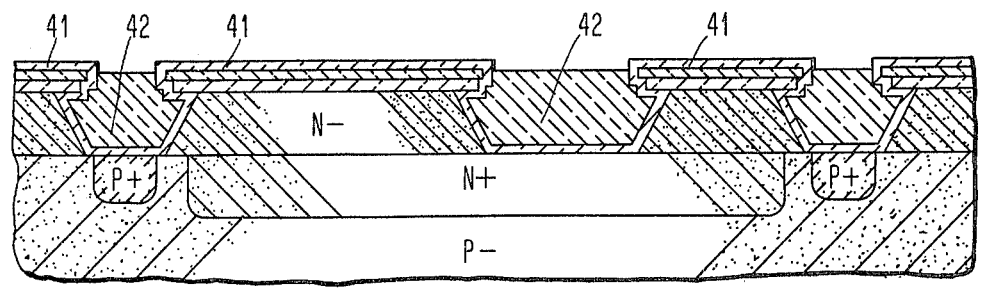

With reference, then, to FIG. 3H, utilizing conventional photolithographic etching techniques, the elevated portions 42' of layer 42 are removed with a conventional etchant for silicon dioxide to expose silicon oxynitride layer 41 at the structure's surface and to, in effect, substantially planarize the structure. A suitable etchant which will remove the silicon dioxide without disrupting the silicon oxynitride layer 41 is the standard buffered HF etchant for silicon dioxide. After the removal of elevations 42', photoresist mask 44 is stripped away in the conventional manner to leave the structure shown in FIG. 3H.

At the next stage, the surface of the structure will be prepared for the selective introduction of conductivity-determining impurities into some of the silicon pockets 35. First, it will be necessary to remove the portions of layer 41 which are exposed at the surface of the structure, after which underlying layer 36 is removed to provide the structure shown in FIG. 3I. Where layer 41 is silicon oxynitride and underlying layer 36 is silicon nitride, the two layers may be removed by treating the structure with a conventional etchant such as hot phosphoric acid or a hot phosphoric salt which will remove layers 41 and 36 without affecting silicon dioxide underlying layer 37 or the silicon dioxide dielectric isolation layer 42 in the trenches 34.

With the structure shown in FIG. 3I, it is now possible to perform appropriate introduction of impurities into selected pockets 35 merely by the removal of the silicon dioxide layer 37 covering the pockets and diffusing or ion implanting into the exposed pocket.

In the structure shown in FIG. 3J, a photoresist block-out mask 45 is formed in the conventional manner. This block-out mask is all that is necessary to define the P type region 48 which is to be formed by the introduction of impurities into N- pocket 35'. After blockout photoresist mask 45 was formed, the exposed portion of silicon dioxide layer 37 within aperture 46 of the block-out mask is removed by subjecting the structure to a conventional etchant for silicon dioxide, e.g., buffered hydrofluoric acid.

Since this etchant does not attack oxynitride layer 41 and particularly the portions 41' of the silicon nitride layer which lie under the undercut portion of removed layer 37, the sidewalls of pocket 35' are not exposed by the buffered HF etchant and remain covered. Even if, as shown for illustration in FIG. 3J, portions of the latteral silicon dioxide isolation regions 42 are attacked by the buffered HF at points 47, silicon oxynitride walls 41 will prevent the sides of silicon pocket 35' from being exposed. Then, when the P type impurities, which may, for example, be boron, are introduced to form region 48, as shown, there will be no introduction of these impurities along the sidewalls of silicon pocket 35'. This will avoid a problem peculiar to some recessed oxide or dielectric isolation defined impurity introduction steps wherein there tends to be a greater penetration of impurities down from the exposed surface along the sidewalls of the structure. In the present structure, the penetration of P type impurities will be substantially to a uniform depth throughout pocket 35'.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In the method of fabrication of planar semiconductor integrated circuits by the selective introduction of impurities into said integrated circuit, the steps of
    forming a first layer of electrically insulative material over a planar surface of an integrated circuit member,
    forming a pattern of apertures through said first layer to expose the underlying surface,
    etching through said apertures with an etchant which preferentially etches said surface for a time sufficient so that said first layer is undercut adjacent said apertures,
    depositing a second layer of electrically insulative material under the undercut portions of said first layer, said first insulative material more etchable than said second insulative material in selected etchants,
    removing selected portions of said first insulative layer from said surface adjacent said undercut portions with an etchant which preferably etches said first layer, said second layer under the undercut portions of the first layer protecting said surface in said undercut portions during the etching, and
    introducing conductivity-determining impurities into said surface underlying said removed selected portions, whereby said second layer remaining in said adjacent undercut portions acts as a masking to laterally define the surface areas into which said impurities are introduced.

2. The method of claim 1 wherein said first layer of electrically insulative material is formed directly on the surface of a semiconductor substrate, and the semiconductor substrate surface is etched to undercut said first layer.

3. The method of claim 1 wherein said second layer consists essentially of silicon oxynitride and at least the portion of the first layer over the undercut surface comprises silicon dioxide.

* * * * *